(12) United States Patent
Jackson

(10) Patent No.: US 10,934,219 B2
(45) Date of Patent: Mar. 2, 2021

(54) METHOD OF INCREASING THE UNIFORMITY OF CHEMICAL VAPOR DEPOSITION ON FIBROUS MATERIAL THROUGH THE IMPOSITION OF PRESSURE WAVES

(71) Applicant: United Technologies Corporation, Farmington, CT (US)

(72) Inventor: R. Wesley Jackson, West Hartford, CT (US)

(73) Assignee: Raytheon Technologies Corporation, Waltham, MA (US)

( * ) Notice: Subject to any disclaimer, the term of this patent is extended or adjusted under 35 U.S.C. 154(b) by 360 days.

(21) Appl. No.: 15/849,146

(22) Filed: Dec. 20, 2017

(65) Prior Publication Data

US 2019/0185387 A1    Jun. 20, 2019

(51) Int. Cl.
| | |
|---|---|
| *C04B 40/00* | (2006.01) |
| *C04B 41/45* | (2006.01) |
| *C04B 35/628* | (2006.01) |
| *D02J 1/18* | (2006.01) |
| *H01L 41/08* | (2006.01) |
| *C04B 35/80* | (2006.01) |
| *C23C 16/458* | (2006.01) |
| *C23C 16/04* | (2006.01) |

(52) U.S. Cl.
CPC .... *C04B 40/0067* (2013.01); *C04B 35/62844* (2013.01); *C04B 35/62884* (2013.01); *C04B 35/80* (2013.01); *C04B 41/4552* (2013.01); *C23C 16/045* (2013.01); *C23C 16/458* (2013.01); *D02J 1/18* (2013.01); *H01L 41/08* (2013.01); *C04B 2235/5208* (2013.01); *C04B 2235/60* (2013.01); *C04B 2235/74* (2013.01)

(58) Field of Classification Search
CPC ............ C04B 35/62844; C23C 16/045; C23C 16/4404; C23C 16/4415; Y10S 427/10; Y10S 427/101; B41J 2/1642
USPC ......................................... 264/71
See application file for complete search history.

(56) References Cited

U.S. PATENT DOCUMENTS

| | | | | |
|---|---|---|---|---|
| 4,302,311 A | * | 11/1981 | Lowe ...................... | C03C 17/09 204/192.13 |
| 4,944,244 A | | 7/1990 | Moisan et al. | |
| 5,322,711 A | * | 6/1994 | Gabor ................... | C04B 41/009 427/249.3 |
| 5,614,272 A | * | 3/1997 | Shah .................. | C04B 35/62873 427/249.8 |

(Continued)

OTHER PUBLICATIONS

Ultrasonic-assisted electroless deposition of Ag on PET fabric with low silver content for EMI shielding authors: LuY vol. 204 issue: 16-17 p. 2829-2833 docId: 02578972 (Year: 2010).*

(Continued)

*Primary Examiner* — Xiao S Zhao
*Assistant Examiner* — Edgaredmanuel Troche
(74) *Attorney, Agent, or Firm* — Kinney & Lange, P.A.

(57) ABSTRACT

A method of infiltrating a fiber structure with a coating and a matrix material includes connecting a wave guide to a fiber structure comprising a plurality of fibers, applying vibration to the fiber structure to separate adjacent fibers at contact points, and depositing a coating on a surface of each of the fibers including contact point surfaces where adjacent fibers have been separated.

18 Claims, 3 Drawing Sheets

(56) References Cited

U.S. PATENT DOCUMENTS

| | | | | |
|---|---|---|---|---|
| 5,681,511 A | * | 10/1997 | Streckert | C04B 35/571 |
| | | | | 264/29.7 |
| 5,902,528 A | * | 5/1999 | Spragg | B28B 1/44 |
| | | | | 249/144 |
| 6,143,376 A | * | 11/2000 | Linn | C04B 35/62844 |
| | | | | 427/249.15 |
| 6,149,785 A | * | 11/2000 | Makowiecki | B22F 1/025 |
| | | | | 204/298.11 |
| 6,391,396 B1 | | 5/2002 | Barmatz et al. | |
| 9,394,604 B2 | | 7/2016 | Baechle et al. | |
| 9,758,436 B2 | | 9/2017 | Lazur et al. | |
| 2002/0127327 A1 | * | 9/2002 | Schwarz | A61L 27/54 |
| | | | | 427/2.15 |
| 2007/0210470 A1 | * | 9/2007 | Kindle | B01J 2/18 |
| | | | | 264/71 |
| 2011/0124253 A1 | * | 5/2011 | Shah | B82Y 30/00 |
| | | | | 442/60 |
| 2016/0251269 A1 | * | 9/2016 | Luthra | B32B 7/02 |
| | | | | 428/212 |

OTHER PUBLICATIONS

Extended European Search Report for EP Application No. 18213612.7, dated May 21, 2019, 9 pages.

Y. Lu, et al., "Ultrasonic-assisted electroless deposition of Ag on PET fabric with low silver content for EMI shielding", from Surface & Coating Technology 204 (2010), pp. 2829-2833.

* cited by examiner

METHOD OF INCREASING THE UNIFORMITY OF CHEMICAL VAPOR DEPOSITION ON FIBROUS MATERIAL THROUGH THE IMPOSITION OF PRESSURE WAVES

BACKGROUND

The present invention relates generally to the manufacture of fibrous components and, more particularly, to the manufacture of ceramic matrix composites (CMC) using chemical vapor deposition.

CMCs are composite materials formed from ceramic fibers embedded in a ceramic matrix. CMCs can be used in a wide variety of applications, but are particularly suited for use in high temperature environments, such as present in aerospace applications. CMCs offer advantages over conventional superalloys and monolithic ceramics. With respect to conventional superalloys, CMCs have superior thermal resistance. Specifically, CMCs retain creep resistance (resistance to temporally progressive plastic deformation) and stiffness. With respect to monolithic ceramics, CMCs have superior toughness or resistance to fracture due to small crack growth (i.e., cracks can form in CMCs and grow a short distance without propagating through the part and inducing fracture).

CMCs can be formed using a method of chemical vapor deposition (CVD) known as chemical vapor infiltration (CVI), a process in which matter is deposited from vapor onto surfaces (internal and external) of a porous structure. Ceramic fibers can be laid up using conventional processes to form a fiber preform. CVI can be used to deposit ceramic matrix material on and between the fibers. To prevent crack propagation through the fibers, an interface coating can be deposited on the ceramic fibers. The interface coating is conventionally applied to individual tows of fibers. Because adjacent fibers of a fiber preform can concatenate by sintering during the deposition process, it has not been feasible to deposit the interface coating after the fiber preform has been made.

SUMMARY

In one aspect, a method of infiltrating a fiber structure with a coating and a matrix material includes connecting a wave guide to a fiber structure comprising a plurality of fibers, applying vibration to the fiber structure to separate adjacent fibers at contact points, and depositing a coating on a surface of each of the fibers including contact point surfaces where adjacent fibers have been separated.

In another aspect, a method of converting a ceramic fiber structure to a ceramic matrix composite includes connecting a wave guide to a fiber structure comprising a plurality of fibers, applying vibration to the fiber structure to separate adjacent fibers at contact points, and depositing a matrix material to densify the fiber structure.

The present summary is provided only by way of example, and not limitation. Other aspects of the present disclosure will be appreciated in view of the entirety of the present disclosure, including the entire text, claims and accompanying figures.

Figure 1:
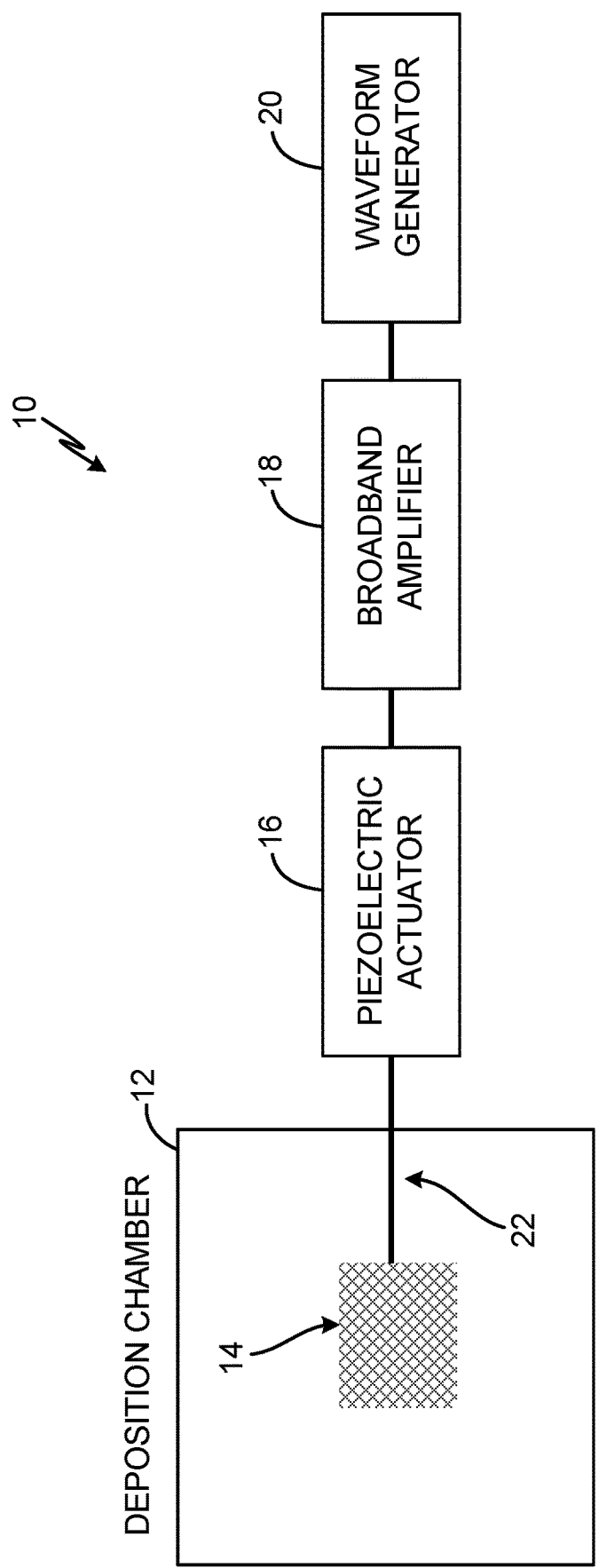
FIG. 1 is a schematic drawing of one embodiment of a system for manufacture of a ceramic matrix composite (CMC) structure.

While the above-identified figures set forth embodiments of the present invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features, steps and/or components not specifically shown in the drawings.

DETAILED DESCRIPTION

Vibration can be applied to fibers in a fiber structure (preform or sheet) during chemical vapor deposition to separate fiber tows as well as fibers forming the fiber tows and allow uniform deposition of an interface coating and effective distribution of a matrix material to densify the fiber structure. Vibration can be applied via a waveguide inserted into or placed in contact with the fiber structure and connected to a piezoelectric actuator. The method is particularly suited for the manufacture of ceramic matrix composites (CMCs), however, is generally applicable to the fabrication of fiber-reinforced composite structures, as will be understood by one of ordinary skill in the art.

Figure 2:
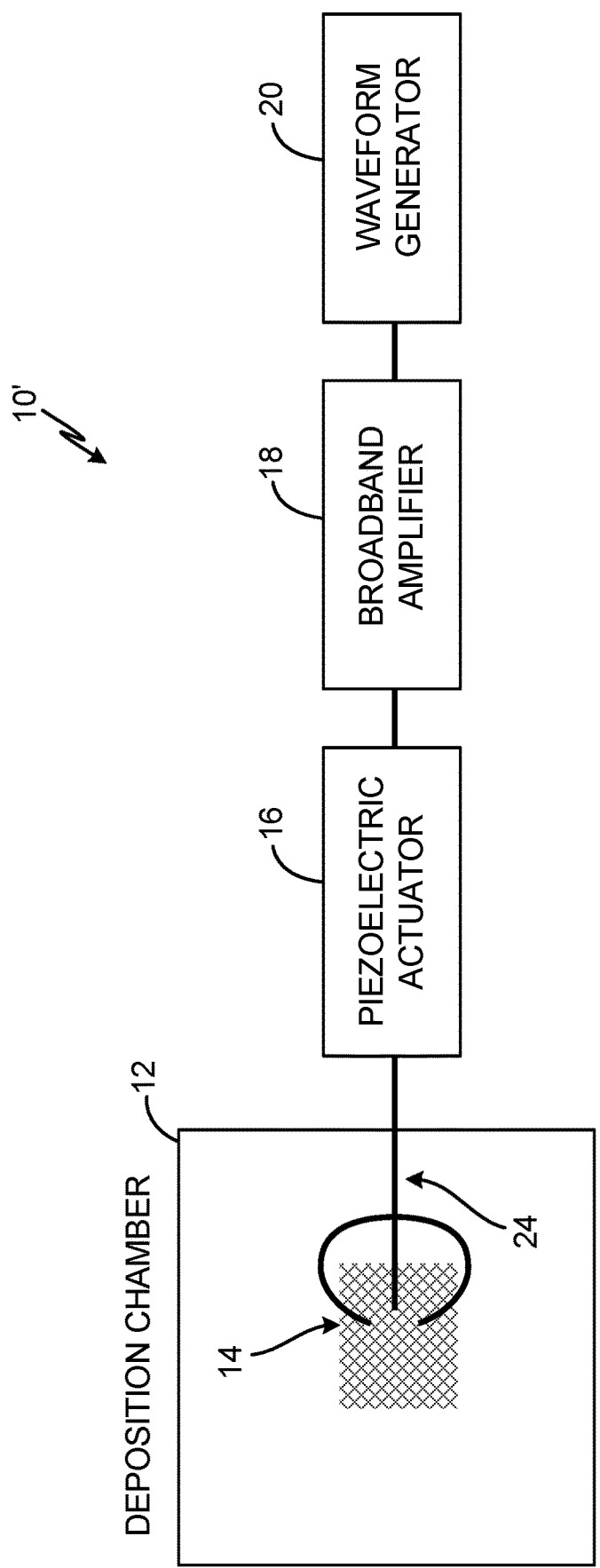
FIG. 2 is a schematic drawing of another embodiment of a system for manufacture of a CMC structure.

FIGS. 1 and 2 are schematic drawings of two embodiments of a system for the manufacture of a CMC component. FIGS. 1 and 2 are discussed concurrently, herein. FIGS. 1 and 2 each show system 10 and 10', respectively, including deposition chamber 12, fiber structure or preform 14, piezoelectric actuator 16, broadband amplifier 18, and waveform generator 20. FIG. 1 also includes a dense rod waveguide 22, whereas FIG. 2 includes fiber waveguide 24. Fiber preform 14 is housed in deposition chamber 12. Waveguide 22 or 24 can be placed in contact with fiber preform 14 on one end and piezoelectric actuator 16 on the other end. Waveguide 22 or 24 can extend through a hermetic port (not shown) in a wall of deposition chamber 12 to connect to piezoelectric actuator 16 located outside of deposition chamber 12. Piezoelectric actuator 16 can be used to apply vibration to fiber preform 14 through the chamber wall during the deposition process.

CMCs can be manufactured using chemical vapor deposition (CVD), also referred to as chemical vapor infiltration (CVI) when, as is the case in the present application, the reactive gases are applied to porous substrates that allow for material deposition internal to the structure. CMCs include fibers, an interface coating, and matrix material. The fibers provide the skeletal structure of the CMC, while the matrix material fills in the gaps between fibers and the coating provides an interface between the fibers and the matrix material. The fiber structure (e.g., fiber preform 14) can be placed in deposition chamber 12 where both the interface coating and matrix material can be deposited on the fibers using CVI. The matrix material can also deposit between fibers filling the porosity of the structure. The interface coating serves to deflect cracks that can propagate in the CMC. The coating provides a weak interface between the matrix material and the fiber, which causes cracks that may form in the matrix to deflect at the interface and propagate along the length of the fiber as opposed to across the fiber. The use of interface coatings toughens and increases damage resistance of the CMC.

Fiber preform 14 can be a structure of any shape formed from fibers, typically in the form of a woven fabric. Generally, fiber preform 14 can be made from fibers tows (typically bundles of 500 untwisted fibers), which can be woven, braided, or otherwise oriented as is known in the art. Multiple sheets of the fabric can be placed in a mold to form a desired shape. The mold can be a cage or similarly open structure, which can allow reactive gases to infiltrate fiber preform 14 during CVI. Fibers can be any ceramic material, including, but not limited to, carbon or silicon carbide (e.g., Nicalon, Hi-Nicalon™, or HI-NICALON™ Type S) as known in the art for the manufacture of CMCs. Although the deposition method discussed herein refers to a "preform," the method, in part or in whole, can also be applied to a single sheet of fabric.

The matrix material can be any ceramic material, including, but not limited to carbon or silicon carbide as known in the art for the manufacture of CMCs. Generally, the matrix material is the same material as the fibers. Interface coating can be boron nitride or other suitable coating as known in the art. Interface coating is deposited before the matrix material and can have a thickness of less than 1 micrometer.

Deposition chamber 12 can be a conventional CVD chamber modified with a hermetic port for receiving waveguide 22 or 24. Deposition chamber 12 can provide a controlled gas atmosphere for CVI conducted under vacuum or at atmospheric pressure. The CVI process allows material to deposit by way of reactive gases at elevated temperatures on fiber and fiber tow surfaces within fiber preform 14 as well as fill in pores between fibers and fiber tows. The temperatures at which CVI is conducted can cause adjacent fiber tows and fibers within each tow to concatenate by sintering thereby preventing complete coverage of the fibers and fiber tows by the interface coating. Even small areas of inter-fiber connection can facilitate crack propagation and when a sufficient number of fibers are joined, the toughness of the composite can be markedly degraded. Furthermore, when fibers are tightly packed, the vapor phase cannot access the interior of the fiber structure or fiber tow, leaving spaces that become closed porosity throughout deposition. Known CVI methods used for producing CMCs have required forming fiber preforms with fibers that have already been coated with an interface coating. In order to provide uniform deposition and full surface coverage of each fiber and fiber tow, the interface coating would have to be applied to each individual tow of untwisted fibers prior to any weaving or braiding of the fiber tows that may be done. This is typically done by slowly pulling a tow of fibers through a deposition chamber. In the present invention vibration is applied to the fibers and fiber tows in preform 14 to promote separation of the fibers and fiber tows at contact points during deposition and thereby promote uniform deposition of the interface coating over a full surface of the fibers and fiber tows, including contact point surfaces. Additionally, the applied vibration promotes infiltration of matrix material to spaces that would otherwise form trapped closed porosity. The increased uniformity and full coverage of the interface coating can improve the fracture toughness of the coating and the resistance to oxidative degradation. The increased uniformity of the deposited matrix material can reduce the porosity of the CMC component. The resultant increased density can provide the CMC component with greater load bearing capacity as well as resistance to environmental degradation by decreasing the access of gas molecules to the interior of the component.

Vibration can be applied to preform 14 by piezoelectric actuator 16 through waveguide 22 or 24. In one embodiment (FIG. 1), waveguide 22 can be a dense rod. In an alternative embodiment (FIG. 2), waveguide 24 can be one or more fiber tows (generally 0.1 to 1 millimeter in diameter). Waveguides 22 and 24 can be placed in contact with (e.g., pressed against) fiber preform 14 or can be inserted into fiber preform 14. Waveguide 24, consisting of one or more fiber tows, can be woven into fiber preform 14 at one or more locations as shown in FIG. 2 to facilitate spatial control of the imposed vibration. Waveguides 22 and 24 can be the same material as the fibers and matrix material or different materials that transfer vibration energy with less loss or can be more easily removed from fiber preform 14. In non-limiting embodiments, waveguide rod 22 can be graphite or silicon carbide and waveguide fibers 24 can be carbon or silicon carbide.

Piezoelectric actuator 16 can be connected to waveform generator 20 and broadband amplifier 18, which can control the frequency and amplitude of piezoelectric actuator 16. In some embodiments, piezoelectric actuator 16 can be made of Navy I or III grade lead-zirconium titanate, as known in the art, and can be capable of vibrating from 10 to 20,000 Hz. The vibration applied to the fibers in preform 14 can cause the fibers to be periodically displaced about their equilibrium position, which can prevent the joining of fibers during deposition due to sintering and allow gas transport into the interior of closely packed fiber bundles to effectively reduce closed porosity. The interval and waveform of the applied vibration can be controlled to promote adequate fiber displacement throughout fiber preform 14 during deposition. Vibration can be applied periodically throughout the deposition process and the frequency can be varied throughout the deposition process. In some embodiments, a different frequency can be applied to preform 14 to separate fibers within a fiber tow than a frequency applied to separate fiber tows. Generally, a lower frequency can result in greater fiber displacement.

Waveguides 22 and 24 can be removed during the deposition process or can remain in place throughout the deposition process and be incorporated into the fully densified CMC component with the portion extending to the piezoelectric actuator cut off at a surface of the component. If removed prior to full densification of the CMC component, waveguide 22 or 24 can be burned out (i.e., in the case of a carbon waveguide) or pulled out. In some embodiments, vibration may be applied only during deposition of the interface coating, in which case, waveguide 22 or 24 can be removed prior to deposition of the matrix material.

Figure 3:
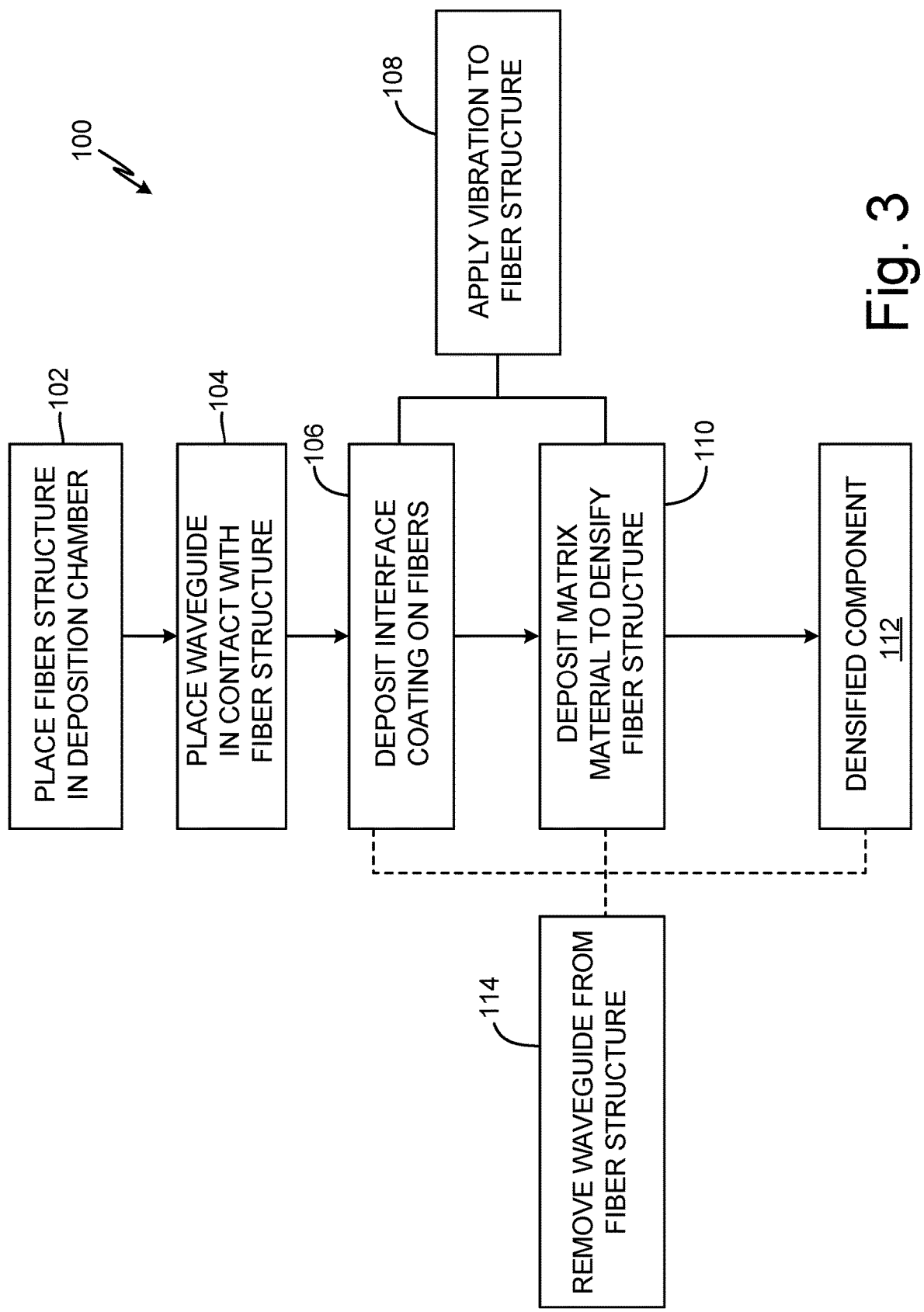
FIG. 3 is a process flow chart for the manufacture of a CMC structure.

FIG. 3 is a process flow chart of method 100 of the manufacture of fiber-reinforced components by CVI. In step 102, fiber structure or preform 14 is placed in deposition chamber 12. In step 104, waveguide 22 or 24 is placed in contact with (e.g., pressed against) or inserted into the fiber preform 14. In step 106, the interface coating is deposited on the fibers and fiber tows. Vibration can be applied to fiber preform 14 in step 108 at any point prior to or during deposition of the interface coating. Generally, vibration can be applied periodically and does not need to be continuous to ensure uniform and full coverage deposition on the fiber surfaces including at contact points. It will be understood by one of ordinary skill in the art to reduce time intervals between applied vibration periods as needed to prevent fibers from concatenating due to sintering. Once the interface coating has been applied to fiber preform 14, matrix material can be deposited (step 110) to fill in pores between fibers and densify fiber preform 14. The application of vibration to fiber preform during deposition of the material matrix can facilitate infiltration of gas vapor into tightly packed areas that would otherwise remain closed porosity throughout deposition. Vibration can be applied at a point prior to or during deposition of the material matrix and can be applied periodically or as needed to effectively shift fibers from their equilibrium position and encourage infiltration. The material matrix can be deposited in step 110 until densified component 112 has been formed. Waveguide 22 or 24 can be removed from fiber preform 14 in step 114 at any point during or following completion of the deposition of the interface coating or the material matrix. Depending on how waveguide 22 or 24 is placed in contact with fiber preform 14 (e.g., pressed against or inserted into), waveguide 22 or 24 may be incorporated into densified component 112. In such case, any portion of waveguide 22 or 24 that extends into densified component 112 will remain incorporated, while the portion extending from densified component 112 to piezoelectric actuator 16 can be cut off or removed at the outer surface of densified component 112.

Applying vibration to fiber preform 14 during CVI can facilitate separating fibers and fiber tows at contact points thereby allowing for the uniform and full coverage deposition of the interface coating on fiber surfaces, including contact points, and improving infiltration matrix material to reduce closed porosity. The increased uniform and full coverage deposition of the interface coating can improve the fracture toughness of the coating and the resistance to oxidative degradation, while the increased density provided by more effective infiltration of the matrix material can provide the component with greater load bearing capacity as well as resistance to environmental degradation by decreasing the access of gas molecules to the interior of the component.

Summation

Any relative terms or terms of degree used herein, such as "substantially", "essentially", "generally", "approximately" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, transient alignment or shape variations induced by thermal, rotational or vibrational operational conditions and the like. Moreover, any relative terms or terms of degree used herein should be interpreted to encompass a range that expressly includes the designated quality, characteristic, parameter or value, without variation, as if no qualifying relative term or term of degree were utilized in the given disclosure or recitation.

Discussion of Possible Embodiments

The following are non-exclusive descriptions of possible embodiments of the present invention.

A method of infiltrating a fiber structure with a coating and a matrix material includes connecting a wave guide to a fiber structure comprising a plurality of fibers, applying vibration to the fiber structure to separate adjacent fibers at contact points, and depositing a coating on a surface of each of the fibers including contact point surfaces where adjacent fibers have been separated.

The method of the preceding paragraph can optionally include, additionally and/or alternatively, any one or more of the following features, configurations and/or additional components or steps:

The method of the preceding paragraph, wherein the wave guide can be a rod connected to a piezoelectric actuator.

The method of any of the preceding paragraphs, wherein the rod can be inserted into the fiber structure.

The method of any of the preceding paragraphs, wherein the wave guide can include a plurality of fibers connected to a piezoelectric actuator.

The method of any of the preceding paragraphs, wherein the plurality of fibers connected to the piezoelectric actuator can be woven into the fiber structure.

The method of any of the preceding paragraphs and further including depositing a matrix material to densify the fiber structure.

The method of any of the preceding paragraphs, wherein the wave guide can be removed from the fiber structure prior to the completion of one of the steps consisting of depositing the coating and depositing the matrix material.

The method of any of the preceding paragraphs, wherein vibration can be applied periodically during at least one of the steps of depositing the coating and depositing the matrix material.

The method of any of the preceding paragraphs, wherein the wave guide can be incorporated into the fiber structure and a component comprising the fiber structure.

The method of any of the preceding paragraphs, wherein the plurality of fibers of the fiber structure make up a plurality of fiber tows with each tow consisting of multiple fibers, and wherein separating adjacent fibers by applying vibration to the fiber structure can include separating adjacent fibers within each tow at contact points and separating adjacent tows at contact points.

The method of any of the preceding paragraphs, wherein vibration can be applied to the fiber structure at a first frequency to separate adjacent fibers within a fiber tow and applied to the fiber structure at a second frequency to separate adjacent tows. The first and second frequencies can be different.

The method of any of the preceding paragraphs, wherein the fiber structure can be a fiber preform in a shape of a component.

A method of converting a ceramic fiber structure to a ceramic matrix composite includes connecting a wave guide to a fiber structure comprising a plurality of fibers, applying vibration to the fiber structure to separate adjacent fibers at contact points, and depositing a matrix material to densify the fiber structure.

The method of the preceding paragraph can optionally include, additionally and/or alternatively, any one or more of the following features, configurations and/or additional components or steps:

The method of the preceding paragraph, wherein the wave guide can include a rod or a plurality of fibers connected to a piezoelectric actuator.

The method of any of the preceding paragraphs, wherein the piezoelectric actuator can be connected to a waveform generator and a broadband amplifier capable of controlling a frequency and amplitude of the piezoelectric actuator.

The method of any of the preceding paragraphs, wherein the wave guide can include the same material as the plurality of fibers of the fiber structure.

The method of any of the preceding paragraphs, wherein the wave guide can be inserted into the fiber structure.

The method of any of the preceding paragraphs and further including depositing a coating on a surface of each of the fibers including contact point surfaces where adjacent fibers have been separated. The coating is deposited before the matrix material is deposited.

The method of any of the preceding paragraphs, wherein the wave guide can be removed from the fiber structure prior to the completion of one of the steps consisting of depositing the coating and depositing the matrix material.

The method of any of the preceding paragraphs, wherein the plurality of fibers of the fiber structure make up a plurality of fiber tows with each tow consisting of multiple fibers, and wherein separating adjacent fibers by applying vibration to the fiber structure can include separating adjacent fibers within each tow at contact points and separating adjacent tows at contact points.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of infiltrating a fiber structure with a coating and a matrix material, the method comprising:
    connecting a wave guide to a fiber structure comprising a plurality of fibers arranged to form a fiber preform of a component or a sheet of fabric; wherein the wave guide is selected from the group consisting of a rod inserted into the fiber structure and a plurality of fibers;
    applying vibration to the fiber structure, wherein the vibration separates adjacent fibers at contact points between fibers; and
    depositing a coating on a surface of each of the fibers including contact point surfaces where adjacent fibers have been separated.

2. The method of claim 1, wherein the wave guide is a rod connected to a piezoelectric actuator.

3. The method of claim 1, wherein the wave guide comprises a plurality of fibers connected to a piezoelectric actuator.

4. The method of claim 3, wherein the plurality of fibers connected to the piezoelectric actuator are woven into the fiber structure.

5. The method of claim 1, further comprising:
    depositing a matrix material to densify the fiber structure.

6. The method of claim 5, wherein the wave guide is removed from the fiber structure prior to the completion of one of the steps consisting of depositing the coating and depositing the matrix material.

7. The method of claim 5, wherein vibration is applied periodically during at least one of the steps of depositing the coating and depositing the matrix material.

8. The method of claim 5, wherein the wave guide is incorporated into the fiber structure and a component comprising the fiber structure.

9. The method of claim 1, wherein the plurality of fibers of the fiber structure make up a plurality of fiber tows, each tow consisting of multiple fibers, and wherein separating adjacent fibers by applying vibration to the fiber structure comprises separating adjacent fibers within each tow at contact points and separating adjacent tows at contact points.

10. The method of claim 9, wherein vibration is applied to the fiber structure at a first frequency to separate adjacent fibers within a fiber tow and applied to the fiber structure at a second frequency to separate adjacent tows, wherein the first and second frequencies are different.

11. The method of claim 1, wherein the fiber structure is a fiber preform in a shape of a component.

12. A method of converting a ceramic fiber structure to a ceramic matrix composite, the method comprising:
    connecting a wave guide to a fiber structure comprising a plurality of fibers arranged to form a fiber preform of a component or a sheet of fabric; wherein the wave guide is selected from the group consisting of a rod inserted into the fiber structure and a plurality of fibers woven into the fiber structure;
    applying vibration to the fiber structure, wherein the vibration separates adjacent fibers at contact points between fibers;
    depositing a matrix material to densify the fiber structure.

13. The method of claim 12, wherein the wave guide is connected to a piezoelectric actuator.

14. The method of claim 12, wherein the piezoelectric actuator is connected to a waveform generator and a broadband amplifier capable of controlling a frequency and amplitude of the piezoelectric actuator.

15. The method of claim 12, wherein the wave guide comprises the same material as the plurality of fibers of the fiber structure.

16. The method of claim 12 and further comprising:
    depositing a coating on a surface of each of the fibers including contact point surfaces where adjacent fibers have been separated, wherein the coating is deposited before the matrix material is deposited.

17. The method of claim 16, wherein the rod is removed from the fiber structure prior to the completion of one of the steps consisting of depositing the coating and depositing the matrix material.

18. The method of claim 12, wherein the plurality of fibers of the fiber structure make up a plurality of fiber tows, each tow consisting of multiple fibers, and wherein separating adjacent fibers by applying vibration to the fiber structure comprises separating adjacent fibers within each tow at contact points and separating adjacent tows at contact points.

* * * * *